United States Patent
Ockeloen-Korppi et al.

(10) Patent No.: US 11,984,886 B2
(45) Date of Patent: May 14, 2024

(54) SUPERCONDUCTING CIRCUIT WITH MAGNETIC-FLUX-TUNABLE ELEMENTS, AND METHODS FOR MINIMIZING FLUX CROSSTALK BETWEEN MAGNETIC FLUX-TUNABLE ELEMENTS IN SUPERCONDUCTING CIRCUITS

(71) Applicant: IQM FINLAND OY, Espoo (FI)

(72) Inventors: Caspar Ockeloen-Korppi, Espoo (FI); Jukka Räbinä, Kuopio (FI); Johannes Heinsoo, Espoo (FI); Juha Hassel, Espoo (FI)

(73) Assignee: IQM Finland Oy, Espoo (FI)

(*) Notice: Subject to any disclaimer, the term of this patent is extended or adjusted under 35 U.S.C. 154(b) by 0 days.

(21) Appl. No.: 18/503,715

(22) Filed: Nov. 7, 2023

(65) Prior Publication Data

US 2024/0072796 A1 Feb. 29, 2024

Related U.S. Application Data

(63) Continuation of application No. PCT/FI2021/050477, filed on Jun. 22, 2021.

(51) Int. Cl.
*H03K 17/92* (2006.01)

(52) U.S. Cl.
CPC .................... *H03K 17/92* (2013.01)

(58) Field of Classification Search
CPC ...................................... H03K 17/92
USPC ......................................... 327/528
See application file for complete search history.

(56) References Cited

U.S. PATENT DOCUMENTS

2021/0256412 A1* 8/2021 Chen ................. H01P 3/003

FOREIGN PATENT DOCUMENTS

| WO | 2017058194 A1 | 4/2017 |
| WO | 2018182571 A1 | 10/2018 |
| WO | 2022269121 A1 | 12/2022 |

OTHER PUBLICATIONS

International Search Report and Written Opinion issued in PCT/FI2021/050477, dated Mar. 21, 2022.
International Preliminary Report on Patentability issued in PCT/FI2021/050477, dated Jun. 16, 2023.

* cited by examiner

*Primary Examiner* — Tomi Skibinski
(74) *Attorney, Agent, or Firm* — Meunier Carlin & Curfman LLC

(57) ABSTRACT

A superconducting circuit comprises a first and second magnetic-flux-tunable elements. Each of these has a respective flux-sensitive part. First and second current-driven superconductive on-chip flux bias lines are provided. Each of these passes adjacent to the flux-sensitive part of the respective magnetic-flux-tunable element. A first plurality of superconductive stray current paths exists adjacent to the first magnetic-flux-tunable element. A second plurality of superconductive stray current paths exist adjacent to the second magnetic-flux-tunable element. The superconductive stray current paths distribute stray currents originating from the flux line of the other magnetic-flux-tunable element into a respective plurality of stray currents around the respective magnetic-flux-tunable element. This way the stray currents are kept from changing the electric characteristics of the respective magnetic-flux-tunable element.

13 Claims, 7 Drawing Sheets

SUPERCONDUCTING CIRCUIT WITH MAGNETIC-FLUX-TUNABLE ELEMENTS, AND METHODS FOR MINIMIZING FLUX CROSSTALK BETWEEN MAGNETIC FLUX-TUNABLE ELEMENTS IN SUPERCONDUCTING CIRCUITS

CROSS-REFERENCE TO RELATED APPLICATIONS

This application is a continuation of International patent application No. PCT/FI2021/050477, filed on Jun. 22, 2021, and entitled, "SUPERCONDUCTING CIRCUIT WITH MAGNETIC-FLUX-TUNABLE ELEMENTS, AND METHODS FOR MINIMIZING FLUX CROSSTALK BETWEEN MAGNETIC FLUX-TUNABLE ELEMENTS IN SUPERCONDUCTING CIRCUITS," the disclosure of which is expressly incorporated herein by reference in its entirety.

FIELD OF THE INVENTION

The invention concerns the hardware of superconductive circuits. In particular, the invention concerns superconductive circuit elements that react to magnetic flux, as well as circuit elements used to create such magnetic flux.

BACKGROUND OF THE INVENTION

Magnetic-flux-tunable circuit elements, such as superconducting quantum interference devices (SQUIDs), are commonly used in superconducting circuits, for example to realize frequency-tunable qubits and in Josephson parametric amplifiers. To achieve a high density of tunable elements, the magnetic tuning flux is often created by one or more current-driven on-chip flux bias lines, called flux lines for short, passing close by the tunable element. To prevent coupling the tunable element to the dissipative environment, which would for example cause decoherence to a qubit, the flux line needs to terminate to the same ground potential that constitutes the ground for the tunable element itself. In addition, a near continuous ground plane is needed to ensure good RF (radio frequency) grounding conditions for high quality factor qubits.

The termination requirement may lead to there being a current path that runs close to the magnetic-flux-tunable element and that may carry stray currents. Such stray currents will cause interference (unwanted tuning) of the magnetic-flux-tunable element. Stray currents typically originate from flux lines of other circuit elements, hence the interference can be described as flux crosstalk.

FIG. 1 illustrates an example of a magnetic-flux-tunable superconductive circuit element. The exemplary element is a qubit that comprises a plus-shaped superconductive island 101 surrounded by an essentially continuous superconductive ground plane 102. These are both formed on the surface of an insulating substrate, a part of which is visible as the white border 103 around the superconductive island 101. The end of one branch of the superconductive island 101 is linked to a strip 104 of superconductive material by two Josephson junctions, one of which is shown as 105. The flux-sensitive part is the loop 106 between the Josephson junctions. The idea is that a current injected to a superconductive conductor 107 will flow to ground through the strip 104, inducing a magnetic flux of desired magnitude through the loop 106.

FIG. 2 illustrates the same structure in the form of a simplified circuit diagram. The cross-hatched area 201 inside the loop that comprises the two Josephson junctions 202 and 203 is the flux-sensitive part, while the capacitor 204 represents the capacitive part of the qubit. The inductor 205 represents the current path (or the combined effect of all possible current paths) that may carry a current originating from a current source 206 and that may induce a magnetic flux through the loop 201.

FIG. 3 illustrates two qubits of the kind shown in FIGS. 1 and 2 relatively close to each other in a quantum computing circuit, surrounded by a common, continuous ground plane. The figurative representation of the flux-sensitive parts is simplified for graphical clarity. A current source 301 generates a current, the purpose of which is to tune the left-hand qubit 302. The actual, intended, magnetic-flux-inducing current through the respective superconductive strip is shown with arrow 304. If all this current would return to ground through the shortest path as shown with arrow 305, the neighbouring right-hand qubit 303 would experience no flux crosstalk. However, some stray current will flow through the route shown with arrows 306 and 307, causing the flux crosstalk phenomenon. The material through which the stray currents flow is superconductive, i.e. has zero resistance, which means that the stray currents can achieve significant values despite the apparently longer paths they take compared to the primary return current 305.

FIG. 4 illustrates how so-called differentially driven current loops may be used to avoid the problem described above. In FIG. 4 the return path 401 of the tuning current may be grounded somewhere further away from the qubits, as shown with the dashed connection 402. An airbridge, schematically shown as the arch 403, connects the two halves of the ground plane that would otherwise remain only connected to each other by the longer route around the whole qubit. The leftmost and middle qubits 404 and 405 have this structure, while the rightmost qubit 406 has the airbridge replaced with a narrow superconductive isthmus 407 between the current loop used for tuning and the flux-sensitive part of the qubit.

While the structures shown in FIG. 4 avoid the flux crosstalk phenomenon, they create another, possibly more serious problem. Namely, in the absence of the common ground connection close to the qubit, the flux line will capacitively couple the qubit to a dissipative environment (current source), causing dissipation and decoherence of the qubit.

A yet further prior art technique is to use socalled active cancellation of flux crosstalk. This is usually done to first order. For each tunable element n the flux sensitivity to flux line m is measured experimentally, leading to an N×M flux crosstalk matrix (for N tunable elements and M flux lines). An inverse of that matrix is used to actively drive all flux lines with currents that cause the intended tuning of all elements. This technique works well to compensate small levels of crosstalk but requires a large number of calibration measurements as the number of elements increases. Furthermore, any errors in the measurement, current source gain drifts or nonlinearities cause the cancellation to be imperfect.

SUMMARY

It is an objective to present an arrangement and a method for mitigating the disadvantageous effects of flux crosstalk more effectively than in the prior art solutions. Another objective is to prevent or mitigate flux crosstalk with a method and an arrangement that allow large independence between flux tuning of a plurality of magnetic-flux-tunable circuit elements. A further objective is to ensure that the method and arrangement are applicable to systems with large numbers of magnetic-flux-tunable circuit elements.

These and further advantageous objectives are achieved by optimizing the form of the conductor portions that may carry stray currents so that the flux-inducing effects of two or more stray current components cancel each other.

According to a first aspect there is provided a superconducting circuit that comprises a first magnetic-flux-tunable element and a second magnetic-flux-tunable element. Each of these has a respective flux-sensitive part, so that electric characteristics of the magnetic-flux-tunable elements are dependent on a magnetic flux at the location of the respective flux-sensitive part. The superconducting circuit comprises a first current-driven superconductive on-chip flux bias line and a second current-driven superconductive on-chip flux bias line. Each of these passes adjacent to the flux-sensitive part of the respective magnetic-flux-tunable element. The superconducting circuit comprises a first plurality of superconductive stray current paths adjacent to the first magnetic-flux-tunable element and a second plurality of superconductive stray current paths adjacent to the second magnetic-flux-tunable element. Each of the first and second pluralities of superconductive stray current paths is configured to distribute stray currents originating from the flux line of the other magnetic-flux-tunable element into a respective plurality of stray currents around the respective magnetic-flux-tunable element such that said plurality of stray currents are kept from changing the electric characteristics of the respective magnetic-flux-tunable element.

According to an embodiment, the superconducting circuit comprises a common superconductive ground plane around the first and second magnetic-flux-tunable elements. The plurality of stray currents may then be configured to induce mutually cancelling magnetic fluxes at the location of the respective flux-sensitive part. This involves the advantage that very effective continuous grounding can be provided at all parts of the superconducting circuit.

According to an embodiment, each of said first and second flux lines terminates in said common superconductive ground plane through a respective first or second terminating section. The shortest direct path between the first and second terminating sections can be cut by at least one gap in said common superconductive ground plane. The superconducting circuit may comprise, adjacent to each of said first and second terminating sections, a respective superconductive bridge connection across said at least one gap, so that for a given terminating section any current flowing through the respective superconductive bridge connection is directed oppositely to a direction the same current takes flowing to or from said common superconductive ground plane through the terminating section. This involves the advantage that the geometry of the circuit can be tailored according to simulation and experiments so that the stray currents inherently cancel the effects of each other.

According to an embodiment, each of the first and second flux lines comprises a flux-inducing section located adjacent to the respective flux-sensitive part. Each of said first and second terminating sections may then continue from the respective flux-inducing section, be parallel thereto but oppositely directed with respect to current, and be located farther from the respective flux-sensitive part than the respective flux-inducing section. Each of said superconductive bridge connections may be parallel to the respective flux-inducing and terminating sections and connect a point between said flux-inducing and terminating sections to a point of the common superconductive ground plane on the opposite side of the gap. This involves the advantage that the geometry of the structure is applicable for accurate computational simulation.

According to an embodiment, the superconductive bridge connection goes through an airbridge. This involves the advantage that the bridge connection can be made relatively late in the manufacturing process, allowing a simpler substrate structure and versatile ways of choosing the geometry factors of the bridge connection.

According to an embodiment, the superconductive bridge connection goes through a dedicated layer in a superconductive multilayer structure. This involves the advantage that the bridge connection is well protected against environmental factors and does not take up space on top of the substrate.

According to an embodiment, each of said first and second flux lines comprises a differentially driven current loop with respective incoming and outgoing lines between a current source and the respective magnetic-flux-tunable element, and a flux-inducing section between the incoming and outgoing lines adjacent to the respective flux-sensitive part. Each of said first and second flux lines may then be separated from said common superconductive ground plane by gaps extending on both sides of the respective flux line. The superconducting circuit may comprise, adjacent to the first flux-inducing section, a first grounding connection across the gap. The superconducting circuit may also comprise, adjacent to the second flux-inducing section, a second grounding connection across the gap. The superconducting circuit may further comprise superconductive bridge connections across each ensemble of gap, incoming line, outgoing line, and gap, each of said superconductive bridge connections being located farther from the respective flux-sensitive part than the respective grounding connection. This involves the advantage that the outgoing current in each differentially driven current loop can be confined to the outgoing line to a large extent.

According to an embodiment, each of said superconductive bridge connections is located at a distance from the respective flux-sensitive part at which a stray current originating from the flux line of the other magnetic-flux-tunable element is distributed into a first stray current component through the superconductive bridge connection and a second stray current component circulating the respective magnetic-flux-tunable element, so that said first and second stray current components induce mutually cancelling magnetic fluxes at the location of the respective flux-sensitive part. This involves the advantage that the overall geometry can be kept relatively simple.

According to an embodiment, the superconducting circuit comprises a sectioned superconductive ground plane around the first and second magnetic-flux-tunable elements. The sectioning of said sectioned superconductive ground plane may be defined by one or more gaps that prevent the plurality of stray currents from flowing adjacent to the respective flux-sensitive part. This involves the advantage that the spreading of stray currents can be contained into limited parts of the ground plane structure.

According to an embodiment, said sectioned superconductive ground plane comprises a middle section located between said first and second magnetic-flux-tunable elements. The first flux line may then terminate in said middle section, while the second flux line is separated from said middle section by one of said gaps. This involves the advantage that the stray current paths associated with the different magnetic-flux-tunable elements can be kept separate to a large extent.

According to an embodiment, another of said gaps cuts any circular current paths from the second flux line to said middle section around the second magnetic-flux-tunable element. This involves the advantage that the spreading of stray currents can be contained into limited parts of the ground plane structure.

According to an embodiment, a gap in said sectioned superconductive ground plane separates a first section around the first magnetic-flux-tunable element from a second section around the second magnetic-flux-tunable element. This involves the advantage that the spreading of stray currents can be contained into limited parts of the ground plane structure.

According to an embodiment, the superconducting circuit comprises capacitive couplings across one or more of said one or more gaps. This involves the advantage that different sections of the ground plane structure can remain coupled to each other from the viewpoint of high-frequency signals.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 5:
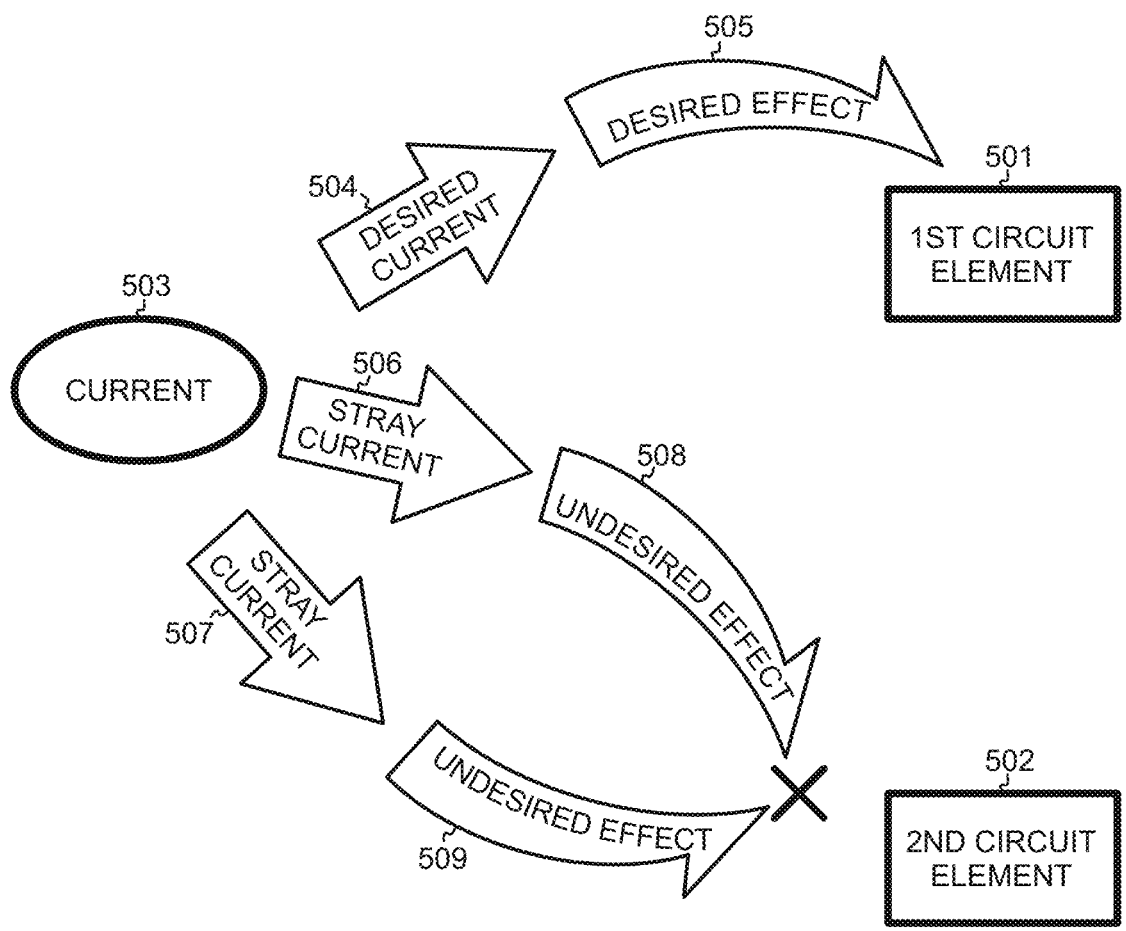
FIG. 5 illustrates a principle according to the invention.

FIG. 5 illustrates schematically the operation of a part of superconducting circuit that comprises a first magnetic-flux-tunable element 501 and a second magnetic-flux-tunable element 502. In order to be magnetic-flux-tunable, both elements 501 and 502 have a respective flux-sensitive part. These are not separately shown in FIG. 5 for graphical clarity. The electric characteristics of each magnetic-flux-tunable element 501 and 502 are dependent on a magnetic flux at the location of the respective flux-sensitive part. An example of such a flux-dependent electric characteristic is resonance frequency, but also other kinds of electric characteristics may come into question.

Additionally, the superconducting circuit the operation of which is schematically shown in FIG. 5 is assumed to have current-driven superconductive on-chip bias lines for producing a desired magnetic flux at the location of each of said flux-sensitive parts. The current-driven superconductive on-chip bias lines may be called flux lines for short. The first flux line passes adjacent to the flux-sensitive part of the first magnetic-flux-tunable element 501, and the second flux line passes adjacent to the flux-sensitive part of the second magnetic-flux-tunable element 502.

Additionally, the superconducting circuit is assumed to define a first plurality of superconductive stray current paths adjacent to the first magnetic-flux-tunable element 501, and a second plurality of superconductive stray current paths adjacent to the second magnetic-flux-tunable element 502. Examples of how these stray current paths may be formed are described in more detail later in this text.

A key feature of the superconductive stray current paths is that they are configured to distribute stray currents originating from the flux line(s) of the other magnetic-flux-tunable element(s) into a respective plurality of stray currents around the respective magnetic-flux-tunable element in a particular way. The result of such distributing is that the plurality of stray currents are effectively kept from changing the electric characteristics of the respective magnetic-flux-tunable element.

In the schematic illustration of FIG. 5, an electric current 503 of selected magnitude is deliberately generated in the purpose of changing the electric characteristics of the first magnetic-flux-tunable element 501. Flowing through the flux line(s) adjacent to the flux-sensitive part of the first magnetic-flux-tunable element 501, the generated current constitutes a desired current 504. In accordance with the principle of magnetic flux tuning. the desired current 504 causes a desired effect 505, such as a change in the resonance frequency of the first magnetic-flux-tunable element 501.

However, as also schematically shown in FIG. 5, the generated electric current 503 may produce stray currents. The routes that the stray currents take through parts of the superconducting circuit may be described as stray current paths. In FIG. 5 it is particularly assumed that there are a plurality of superconductive stray current paths adjacent to the second magnetic-flux-tunable element 502. Similarly, there may be a plurality of superconductive stray current paths adjacent to the first magnetic-flux-tunable element 501. In FIG. 5 these are not considered in detail, because the purpose of FIG. 5 is to evaluate what happens when a desired current 504 flows adjacent to the first magnetic-flux-tunable element 501 but simultaneously causes stray currents 506 and 507 adjacent to the second magnetic-flux-tunable element 502. Considered in isolation, one such stray current 506 would tend to cause an undesired effect 508 and another stray current 507 would tend to cause another undesired effect 509 to the second magnetic-flux-tunable element 502.

According to the principle schematically illustrated in FIG. 5, the plurality of superconductive stray current paths adjacent to the second magnetic-flux-tunable element 502 are configured to distribute the stray currents 506 and 507, which originate from the flux line of the first magnetic-flux-tunable element 501, into such a respective plurality of stray currents around the second magnetic-flux-tunable element 502 that the stray currents are kept from changing the electric characteristics of the second magnetic-flux-tunable element 502. Figuratively, the undesired effects 508 and 509 cancel each other without reaching the second magnetic-flux-tunable element 502. A variety of embodiments are described later in this text for making this happen in practice.

Figure 6:
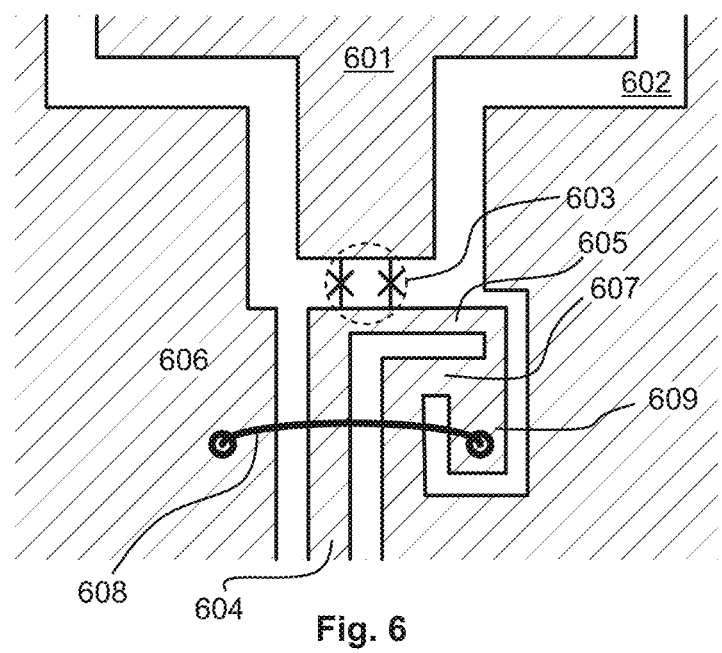
FIG. 6 illustrates a detail in a superconducting circuit according to an embodiment.
Figure 7:
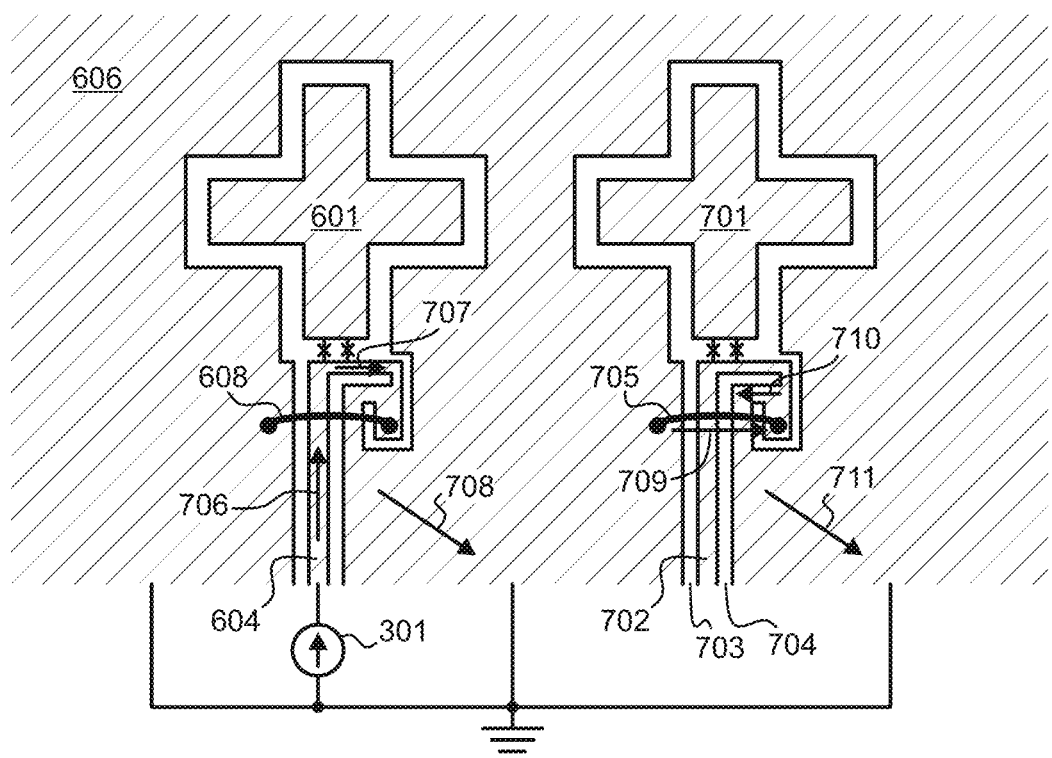
FIG. 7 illustrates a superconducting circuit according to an embodiment.

A first embodiment is illustrated in FIGS. 6 and 7, in which FIG. 6 illustrates a detailed arrangement of superconductive current paths that is used adjacent to the flux-sensitive part of each of the two magnetic-flux-tunable elements in FIG. 7. The superconducting circuit comprises a common superconductive ground plane 606 around the first and second magnetic-flux-tunable elements. The last-mentioned are qubits, each comprising a plus-shaped superconductive island 601 or 701 separated from the ground plane 606 by a border where the surface of the underlying insulating substrate is visible; see border 602 in FIG. 6. At the outer end of one branch in each superconductive island 601 or 701 is a flux-sensitive part, illustrated schematically as 603 in FIG. 6. A respective current-driven superconductive on-chip flux bias line, or flux line for short, comes adjacent to each of the flux-sensitive parts; see flux line 604 and its flux-inducing section 605 in FIG. 6. The specific shape of the flux line and associated structures is such that stray currents, created by a desired current through the flux line of the other magnetic-flux-tunable element, induce mutually cancelling magnetic fluxes at the location of the respective flux-sensitive part.

FIG. 6 shows, using the first flux line 604 as an example, how each of the first and second flux lines 604 and 702 terminates in the common superconductive ground plane 606 through a respective terminating section; see terminating section 607 in FIG. 6. The terminating section 607 of the first flux line 604 may be called the first terminating section, and the terminating section of the second flux line 702 (seen in FIG. 7) may be called the second terminating section. The shortest direct path between the first and second terminating sections is cut by at least one gap in the common superconductive plane. In FIG. 7 there are the gaps 703 and 704 that separate the second flux line 702 from the common ground plane 606. From the viewpoint of the present description, gap 703 has the important purpose of preventing any stray current that originated from the first flux line 604 from reaching the second flux line 702 where it would affect the qubit on the right just like an intended current through the second flux line 702 does. If one would draw an imaginary straight line from the terminating section of the first flux line 604 to that of the second flux line 702, it would go across the gaps 703 and 704.

The superconducting circuit comprises, adjacent to each of the first and second terminating sections introduced above, a respective superconductive bridge connection across at least one gap. In FIG. 6 the superconductive bridge connection 608 is seen, and FIG. 7 shows how a similar superconductive bridge connection 705 is provided adjacent to the second terminating section at the end of the second flux line 702. For a given terminating section, any current flowing through the respective superconductive bridge connection is directed oppositely to a direction the same current takes flowing to or from the common superconductive ground plane 606 through the terminating section.

The last-mentioned is illustrated with arrows in FIG. 7. The intended path for any flux-inducing current for the first magnetic-flux-tunable circuit element is:
in through the first flux line 604 (arrow 706),
through the flux-inducing section 605 (arrow 707),
into the common ground plane 606 through the first terminating section 607, and
out through the shortest path offered by the common ground plane 606 (arrow 708).

Some of the current returning to ground will take a longer path, creating a stray current that flows through the superconductive bridge connection 705 of the second magnetic-flux-tunable circuit element (arrow 709) and continues to the common superconductive ground plane 606 through the second terminating section (arrow 710). As is seen in FIG. 7 by looking at arrows 709 and 710, any such stray current flowing through the second superconductive bridge connection 705 is directed oppositely to a direction the same current takes flowing to the common superconductive ground plane 606 through the second terminating section. Eventually also this stray current will return to ground, as shown with arrow 711.

The geometry utilized in FIGS. 6 and 7 to achieve the current distributions explained above could be characterized in more detail as follows. Each of the first flux line 604 and second flux line 702 comprises a flux-inducing section located adjacent to the respective flux-sensitive part (see flux-inducing section 605 located adjacent to the flux-sensitive part 603 in FIG. 6). Each of the first terminating section and the second terminating section continues from the respective flux-inducing section (see terminating section 607 continuing from the right-hand end of the flux-inducing section 605 in FIG. 6). The terminating section is parallel to the respective flux-inducing section but oppositely directed with respect to current: for example, a current seeking its way to ground will flow from left to right through the flux-inducing section 605 but from right to left through the terminating section 607 in FIG. 6. The terminating section is located farther from the respective flux-sensitive part than the respective flux-inducing section. The superconductive bridge connection is parallel to the flux-inducing and terminating sections. It connects a point between the flux-inducing and terminating sections (tab 609 in FIG. 6) to a point of the common superconductive ground plane on the opposite side of the gap mentioned earlier. In FIG. 6 the left-hand end of the superconductive bridge connection 608 is on the other side of the ensemble that consists of the first flux line 604 and the gaps that separate it from the ground plane 606.

The superconductive bridge connection can be implemented in many ways. As non-limiting examples, it can be an airbridge (i.e. a structure that is partly located above the general surface level of the superconducting circuit) or a flip-chip structure, or it can go through a dedicated layer in a superconductive multilayer structure, such as a multi-layered substrate on the surface of which the visible circuit elements are located.

A current source 301 is shown in FIG. 7 only in association with the first flux line 604. This is a graphical convention for clarity: the currents marked with arrows in FIG. 7 are only those that arise when a biasing current is fed through the first flux line 604 with the purpose of affecting the electric characteristics of the first magnetic-flux-tunable element (the one on the left) in FIG. 7. In practice, there would be also a current source capable of feeding a biasing current through the second flux line 702, with the purpose of affecting the electric characteristics of the second magneticflux-tunable element (the one on the right) in FIG. 7. A practical superconducting circuit may comprise a large number of qubits, Josephson amplifiers, and/or other magnetic-flux-tunable elements, and the same approach can be used for each of them.

Figure 8:
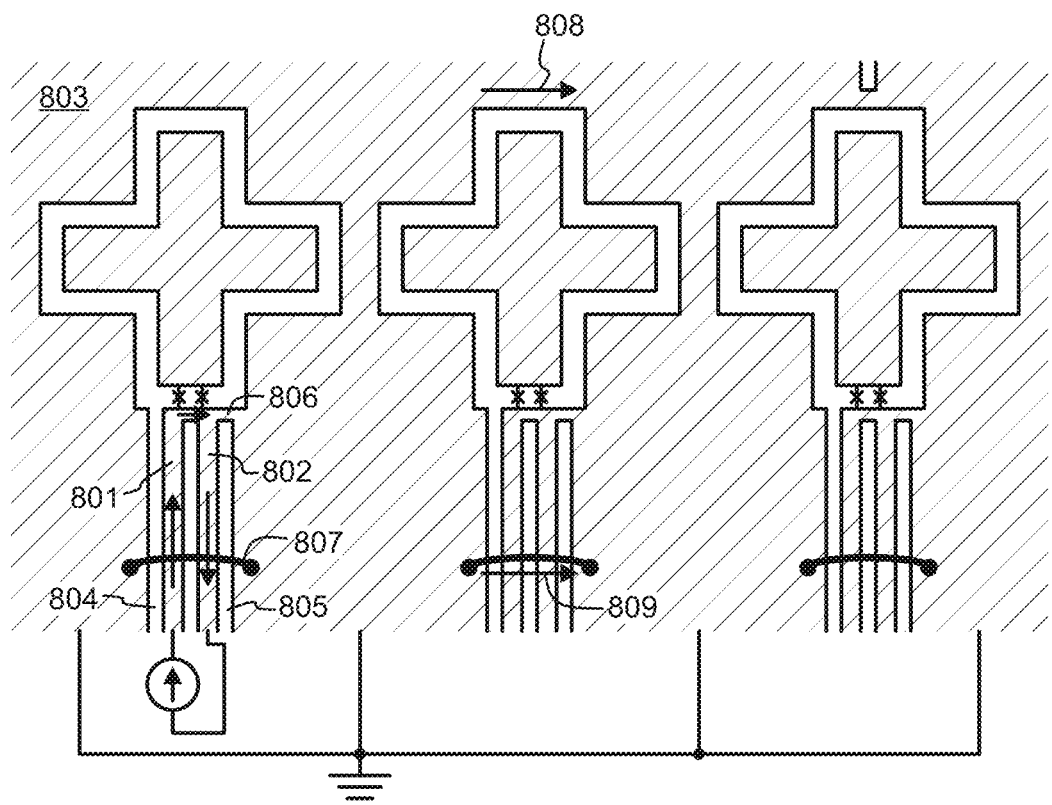
FIG. 8 illustrates a superconducting circuit according to an embodiment.

FIG. 8 illustrates a part of a superconducting circuit according to another embodiment. Also in this embodiment, there are pluralities of superconductive stray current paths configured to distribute stray currents that originate from the flux line of one magnetic-flux-tunable element into a respective plurality of stray currents around the other magnetic-flux-tunable elements. This is done so that said plurality of stray currents are kept from changing the electric characteristics of said other magnetic-flux-tunable elements.

However, this aim is achieved with a slightly different practical implementation than that described above with reference to FIGS. 6 and 7.

In the embodiment of FIG. 8, each flux line couples a current source to the respective magnetic-flux-tunable element and comprises a differentially driven current loop with respective incoming and outgoing lines: for example, see the ingoing line 801 and outcoming line 802 of the leftmost flux line in FIG. 8. A flux-inducing section is located between the incoming and outgoing lines, adjacent to the respective flux-sensitive part. In the leftmost flux line of FIG. 8, the flux-inducing section is the short horizontal section that connects the upper ends of the ingoing line 801 and outcoming line 802.

Each flux line is separated from the common superconductive ground plane 803 by gaps that extend on both sides of the respective flux line; see gaps 804 and 805 in FIG. 8. Adjacent to each flux-inducing section, the superconducting circuit comprises a grounding connection across said gap; for example, see grounding connection 806 in FIG. 8. The superconductive circuit comprises superconductive bridge connections across each ensemble of gap, incoming line, outgoing line, and gap; for example, see superconductive bridge connection 807 in FIG. 8. In each case, the superconductive bridge connection is located farther from the respective flux-sensitive part than the respective grounding connection. As an example, the grounding connection 806 is closer to the flux-sensitive part at the end of the bottom branch of the plus-shaped conductive island than the superconductive bridge connection 807.

The distance between the superconductive bridge connection and the respective flux-sensitive part is of importance to the correct operation of a superconducting circuit according to the embodiment shown in FIG. 8. Namely, the purpose is to balance the stray currents flowing clockwise and anti-clockwise around the other flux-sensitive parts so that their net effect becomes zero. FIG. 8 shows how a desired current, illustrated with the three arrows along the leftmost flux line, also causes some stray currents (because some current "escapes" the leftmost flux line through the grounding connection 806). Seeking its way to ground, some of that stray current will flow around the middle magnetic-flux-tunable element as shown with arrow 808. Another stray current will flow through the superconductive bridge connection across the middle fluxline, as shown with arrow 809. The magnetic flux at the flux-sensitive part of the middle magnetic-flux-tunable element, induced by the upper current 808, is directed oppositely to the magnetic flux induced by the lower current 809. If the dimensioning is right, these two magnetic fluxes cancel each other.

The principle explained above may be characterized as follows. Each of the superconductive bridge connections in FIG. 8 is located at a particular distance from the respective flux-sensitive part. A stray current originating from the flux line of the other magnetic-flux-tunable element is distributed into a first stray current component through the superconductive bridge connection and a second stray current component circulating the respective magnetic-flux-tunable element. Said distance has been selected so that said first and second stray current components induce mutually cancelling magnetic fluxes at the location of the respective flux-sensitive part. Simulation calculations may be used to select the appropriate distance in each case.

Similar to the previous embodiment, various actual implementations are possible for the superconductive bridge connections in FIG. 8, using techniques known as such from the technology of superconducting circuits.

Figure 9:
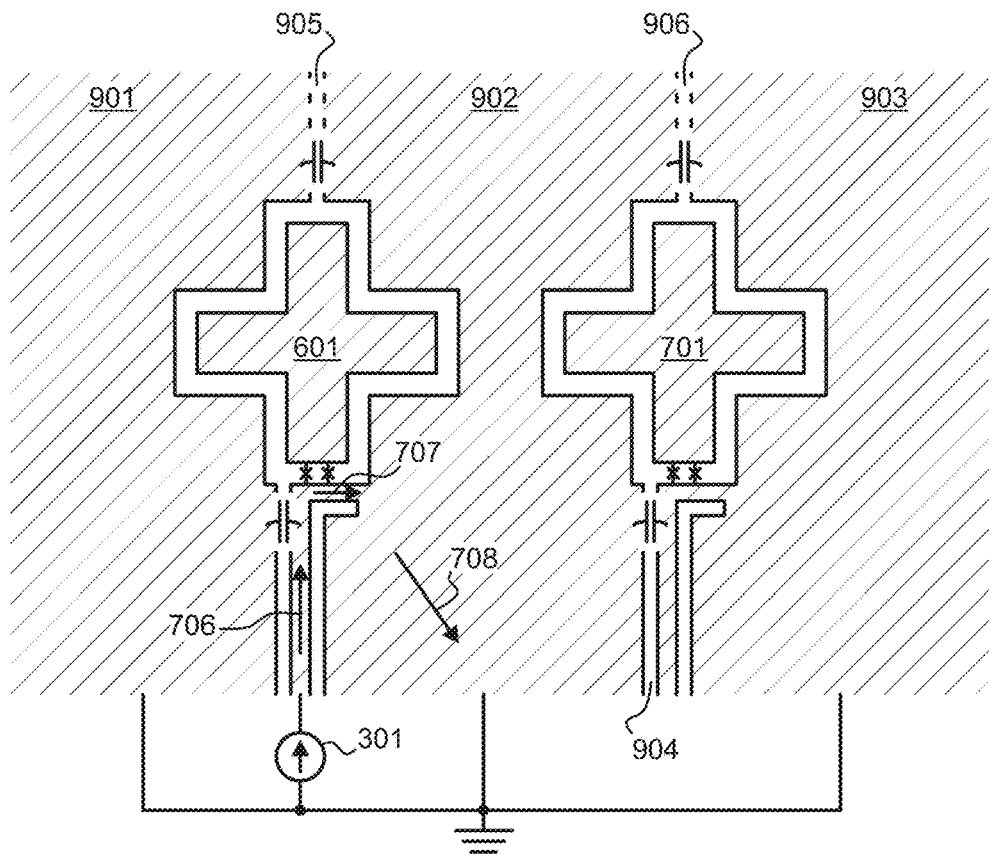
FIG. 9 illustrates a superconducting circuit according to an embodiment.

FIG. 9 illustrates a part of a superconducting circuit according to another embodiment. Similar to FIG. 7, it comprises a first magnetic-flux-tunable element 601 and a second magnetic-flux-tunable element 701, each having a respective flux-sensitive part for changing their electric characteristics through creating a desired magnetic flux at the location of the respective flux-sensitive part. Also similar to FIG. 7, there are first and second flux lines, each passing adjacent to the flux-sensitive part of the respective magnetic-flux-tunable element for the purpose of creating desired currents that create the desired magnetic flux at the location of the respective flux-sensitive part.

As a difference to FIGS. 7 and 8, in FIG. 9 the pluralities of stray current paths are configured to distribute stray currents originating from the flux lines of the other magnetic-flux-tunable element based on frequency. Stray currents that originate from the flux biasing of another magnetic-flux-tunable element are essentially DC currents, or at least of very much lower frequency than the gigahertz-range microwave signals that are used to carry information in quantum computing. To this end, the superconducting circuit of FIG. 9 comprises a sectioned ground plane around the first and second magnetic-flux-tunable elements 601 and 701. The sectioning of the sectioned superconductive ground planes that essentially prevent the stray currents from flowing adjacent to the respective flux-sensitive part. A capacitor—or indeed any way of capacitive coupling—provides a low-impedance connection for gigahertz-range frequencies, but no connection of significance for DC. In place of or in addition to capacitive couplings, resistive couplings can be used for similar purposes. In a resistive coupling the separation is based on superconductor properties and not on frequency.

With respect to the two magnetic-flux-tunable elements 601 and 701 shown in FIG. 9, the sectioned superconductive ground plane comprises: a left section 901 to the left of the first magnetic-flux-tunable element 601; a middle section 902 located between the first and second magnetic-flux-tunable elements 601 and 701; and a right section 903 to the right of the second magnetic-flux-tunable element 701. The first flux line (the one coming adjacent to the first magnetic-flux-tunable element 601 in FIG. 9) terminates in the middle section 902. The second flux line (the one coming adjacent to the second magnetic-flux-tunable element 701 in FIG. 9) is separated from the middle section by one of the gaps that make up the sectioning (see gap 904 in FIG. 9).

Optionally, further ones of said gaps that make up the sectioning may be located on the other side of the magnetic-flux-tunable elements than the flux lines. These are the possible gaps 905 and 906 in FIG. 6, marked with dashed lines. The purpose of such further gaps, if provided, is to cut any circular paths from the protected flux line (the second flux line in FIG. 9) to the middle section 902 around the respective magnetic-flux-tunable element 701.

Figure 10:
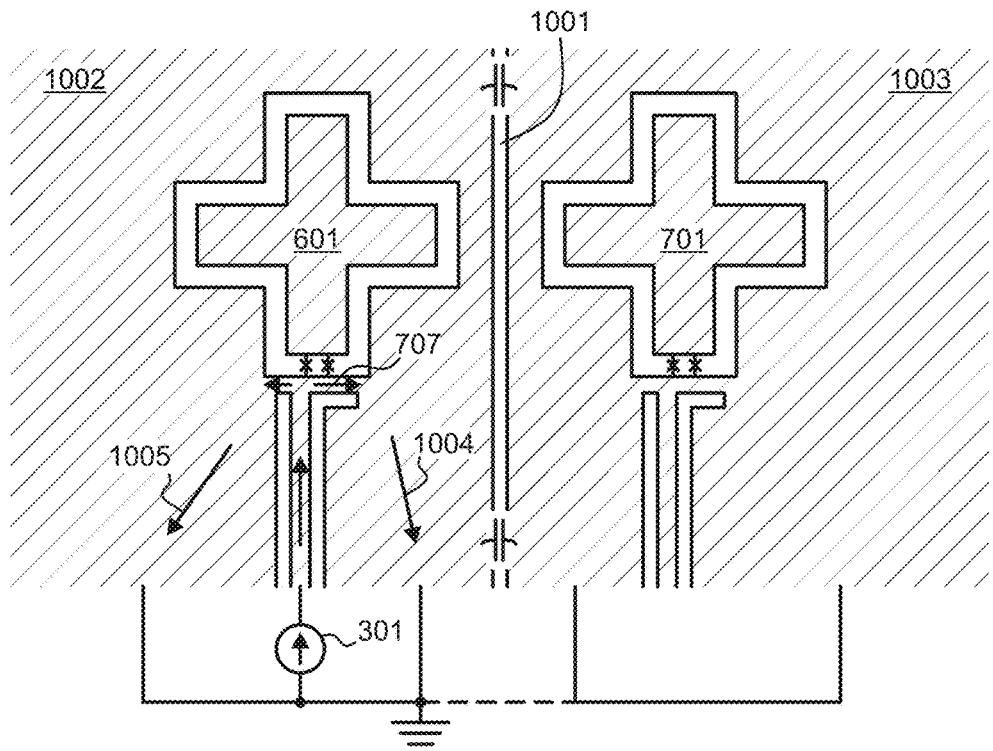
FIG. 10 illustrates a superconducting circuit according to an embodiment

FIG. 10 illustrates a part of a superconducting circuit according to another embodiment. Similar to FIG. 9, also in FIG. 10 the distributing of stray currents is based on frequency. A gap 1001 in the sectioned superconductive ground plane separates a first section 1002 around the first magnetic-flux-tunable element 601 from a second section 1003 around the second magnetic-flux-tunable element 701. A desired current 707 that flows adjacent to the flux-sensitive part of the first magnetic-flux-tunable element 601 returns to ground solely within the first section 1002, as shown with arrows 1004 and 1005.

Capacitive couplings may be provided across one or more of the gaps that make up the sectioning of the superconductive ground plane in embodiments like those in FIGS. 9 and 10. The purpose of such capacitive couplings, if used, is to ensure that the potential of all sections of the superconductive ground plane remains the same at least for RF signals. Instead of or in addition to capacitive couplings, resistive couplings can be used, because any resistive coupling will greatly suppress the flowing of currents in comparison to the superconductive current paths that the ground plane offers to the stray currents.

Figure 1:
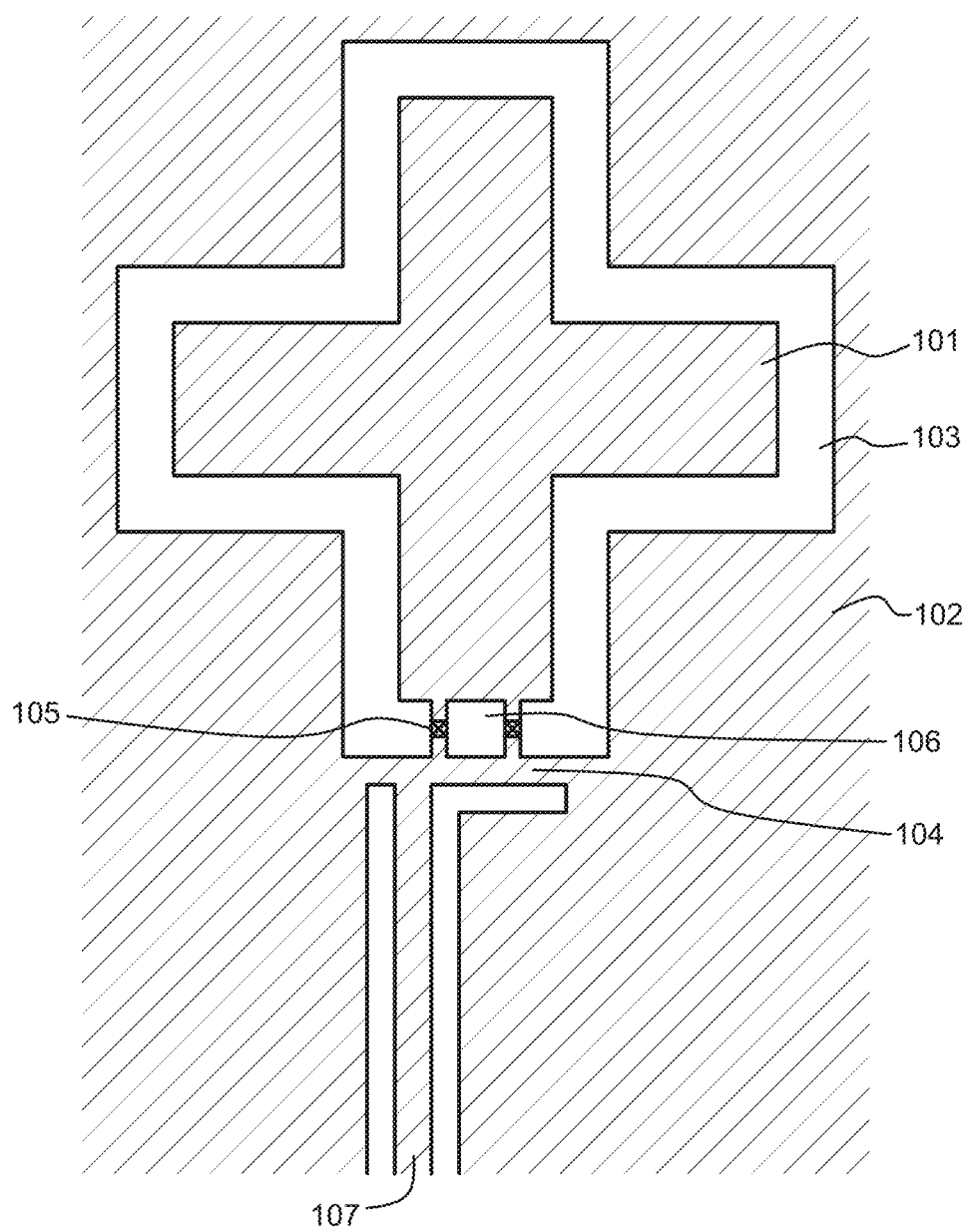
FIG. 1 illustrates a prior art qubit.
Figure 2:
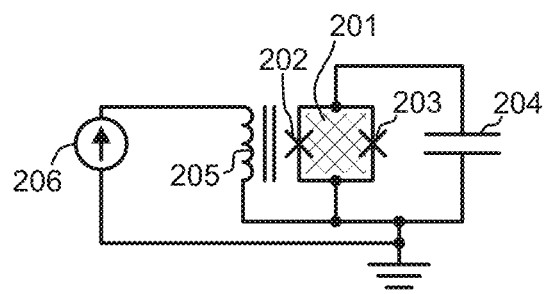
FIG. 2 illustrates the qubit of FIG. 1 in the form of a circuit diagram.
Figure 3:
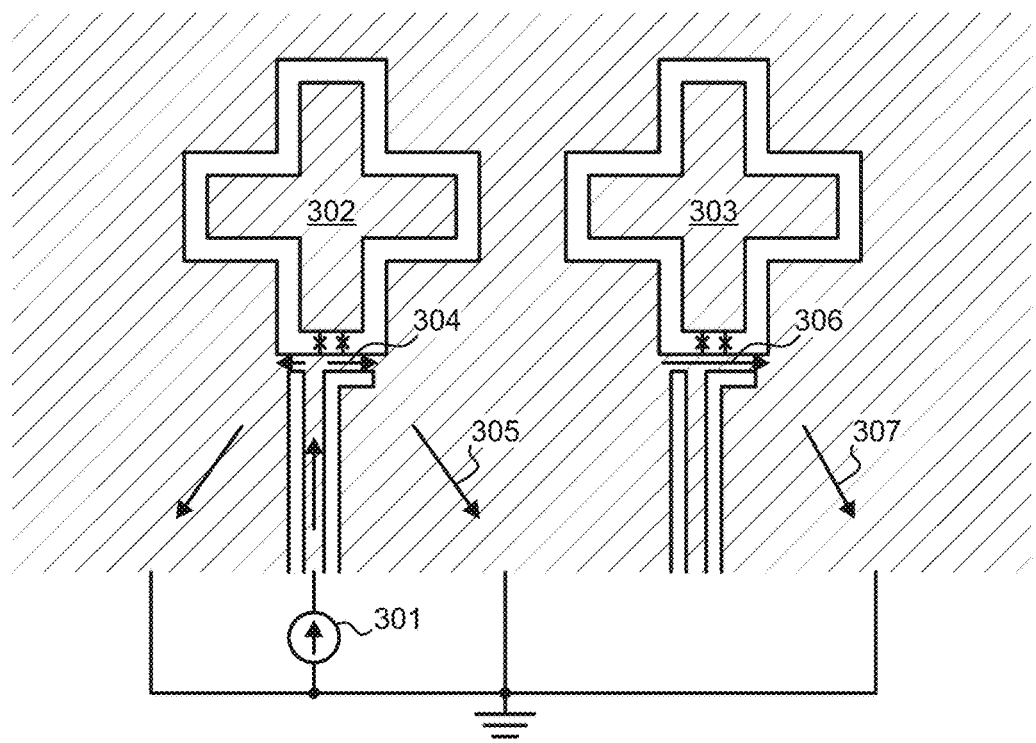
FIG. 3 illustrates the undesired effects of stray currents in a prior art circuit comprising two qubits.
Figure 11:
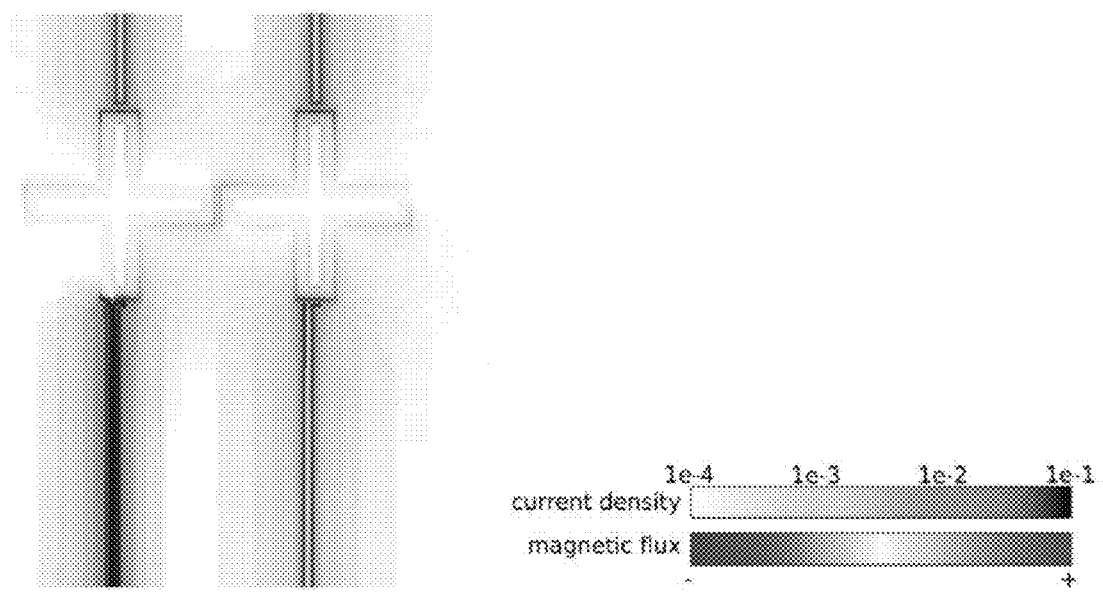
FIG. 11 illustrates a calculational simulation of a prior art superconductive circuit.

FIG. 11 illustrates the results of a calculational simulation performed on a prior art structure like that of FIG. 3. The density of electric current on the superconductive areas is shown with the colour scale ranging from white through yellow and green to black. The magnitude of magnetic flux on the bare substrate areas is shown with the colour scale ranging from blue (negative flux) to red (positive flux). Units of current and flux are irrelevant. As a matter of comparison, the calculational simulation showed a flux of 800 flux quanta per ampere at the flux-sensitive part of the left magnetic-flux-tunable element, and 410 flux quanta per ampere at the flux-sensitive part of the right magnetic-flux-tunable element.

Figure 4:
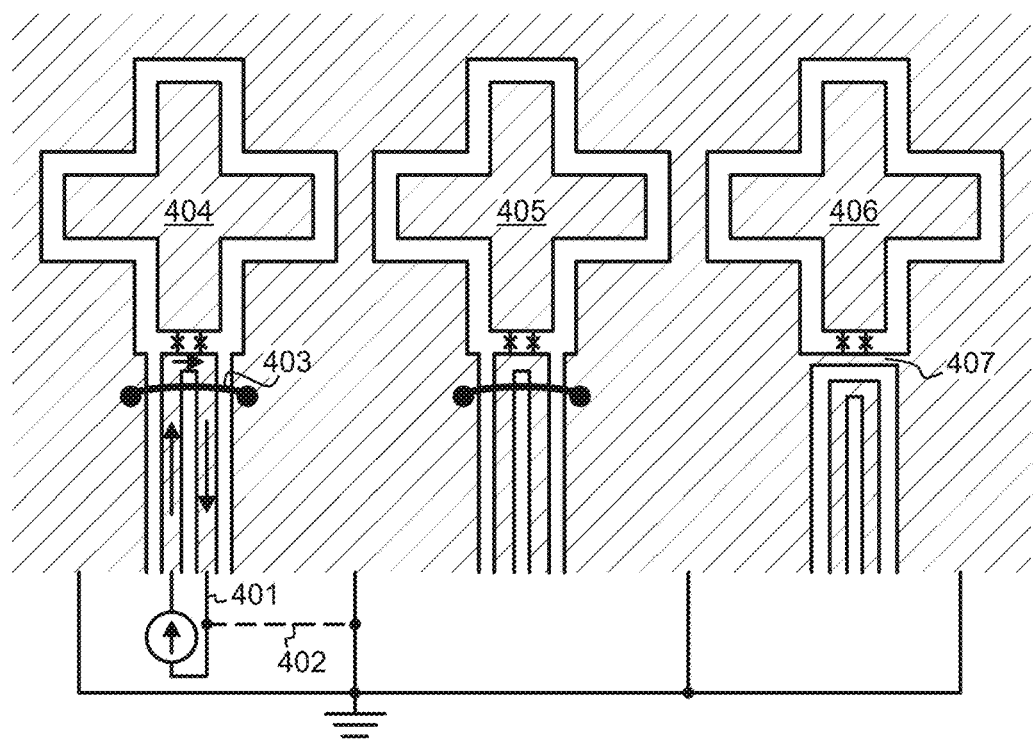
FIG. 4 illustrates some known ways of using differentially driven current loops.
Figure 12:
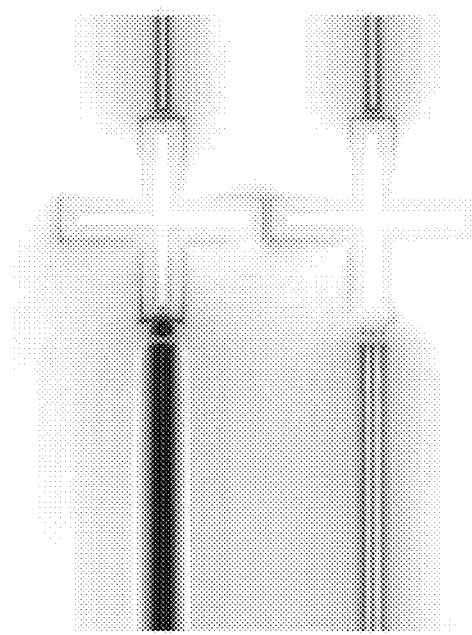
FIG. 12 illustrates a calculational simulation of a prior art superconductive circuit.

FIG. 12 illustrates the results of a similar calculational simulation performed on a prior art structure like that of the magnetic-flux-tunable elements 404 and 405 in FIG. 4. The simulated magnetic fluxes at the flux-sensitive parts of the left and right magnetic-flux-tunable elements were 1200 and −16 respectively. Although a significant improvement compared to FIG. 11, there is still some flux crosstalk.

Figure 13:
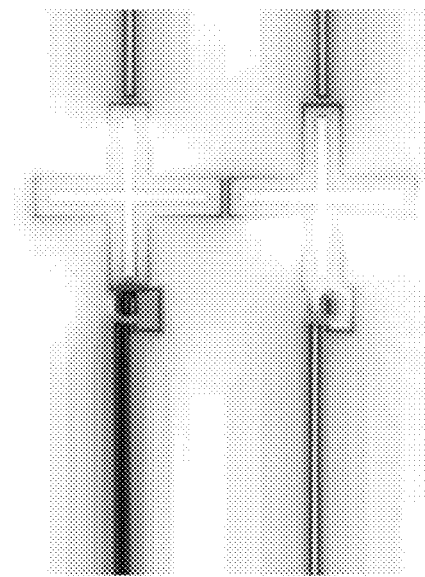
FIG. 13 illustrates a calculational simulation of a superconductive circuit according to an embodiment.
Figure 14:
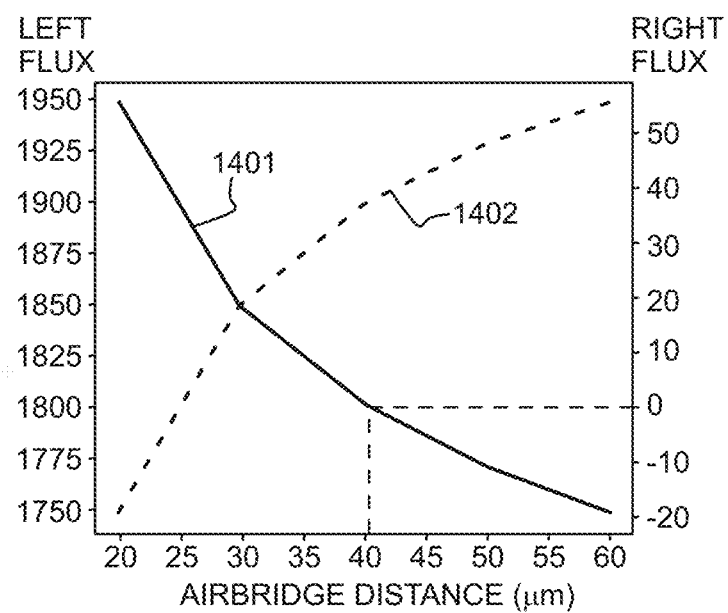
FIG. 14 illustrates the calculated magnetic fluxes as a function of airbridge distance in FIG. 13.

FIGS. 13 and 14 illustrate calculational simulations of a superconductive circuit according to the embodiment shown in FIGS. 6 and 7. In FIG. 14, the induced magnetic fluxes at the respective flux-sensitive parts of the left and right magnetic-flux-tunable elements are shown as a function of the distance between the flux-sensitive element and the respective airbridge. In the simulation, a desired current is directed to the left magnetic-flux-tunable element, in order to cause a predetermined change in its electric characteristics. The desired current gives rise to stray currents on the stray current paths offered by the structure. Graph 1401 illustrates the magnetic flux that the stray currents induce at the flux-sensitive part of the right magnetic-flux-tunable element, the appropriate scale appearing on the right-hand vertical axis in FIG. 14. Graph 1402 illustrates the magnetic flux that the desired current induces at the flux-sensitive part of the left magnetic-flux-tunable element, the appropriate scale appearing on the left-hand vertical axis in FIG. 14.

As shown with the dashed horizontal and vertical lines in FIG. 14, there is an optimum airbridge distance at about 40 micrometers where the combined effect of all stray currents is to take the induced magnetic flux to zero at the flux-sensitive part of the right magnetic-flux-tunable element. The graphical illustration in FIG. 13 has been made with such an airbridge distance.

Figure 15:
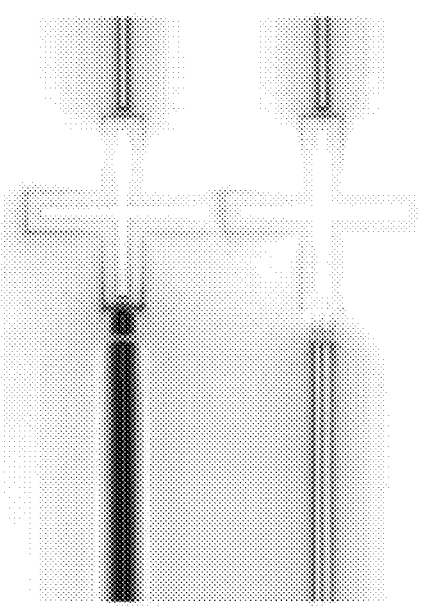
FIG. 15 illustrates a calculational simulation of a superconductive circuit according to an embodiment.
Figure 16:
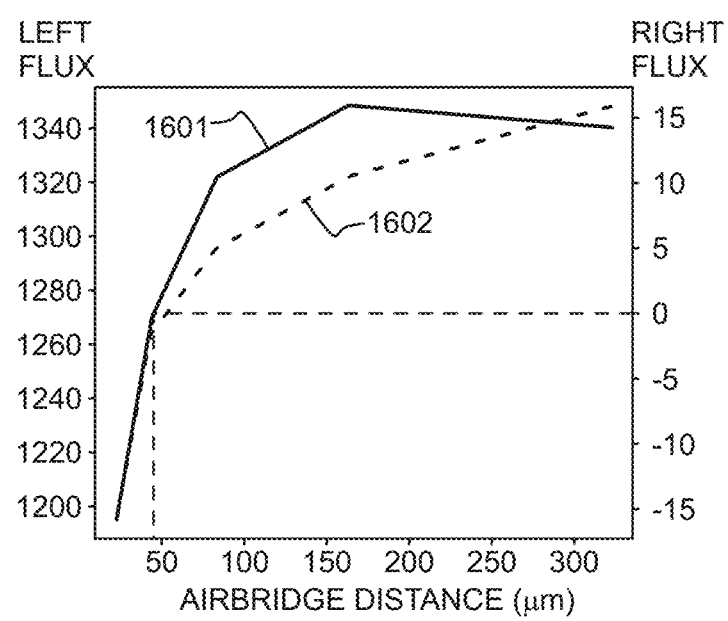
FIG. 16 illustrates the calculated magnetic fluxes as a function of airbridge distance in FIG. 15.

FIGS. 15 and 16 illustrate similar calculational simulations of a superconductive circuit according to the embodiment shown in FIG. 8. Graph 1601 and the right-hand vertical scale pertain to the magnetic flux induced by the stray currents at the flux-sensitive part of the right magnetic-flux-tunable element. Graph 1602 and the left-hand vertical scale pertain to the magnetic flux induced by the desired current at the flux-sensitive part of the left magnetic-flux-tunable element. Again, there appears to be an optimal airbridge distance, this time at little less than 50 micrometers, at which the net effect of the stray currents becomes zero. FIG. 15 illustrates a calculational simulation with the airbridge distance 50 micrometers.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A superconducting circuit, comprising:
    a first magnetic-flux-tunable element and a second magnetic-flux-tunable element, each having a respective flux-sensitive part, electric characteristics of said magnetic-flux-tunable elements being dependent on a magnetic flux at the location of the respective flux-sensitive part,
    a first current-driven superconductive on-chip flux bias line and a second current-driven superconductive on-chip flux bias line, each passing adjacent to the flux-sensitive part of the respective magnetic-flux-tunable element,
    a first plurality of superconductive stray current paths adjacent to the first magnetic-flux-tunable element, and
    a second plurality of superconductive stray current paths adjacent to the second magnetic-flux-tunable element;
    wherein each of the first and second pluralities of superconductive stray current paths is configured to distribute stray currents originating from the current-driven superconductive on-chip flux bias line of the other magnetic-flux-tunable element into a respective plurality of stray currents around the respective magnetic-flux-tunable element such that said plurality of stray currents are kept from changing the electric characteristics of the respective magnetic-flux-tunable element.

2. The superconducting circuit according to claim 1, wherein:
    the superconducting circuit comprises a common superconductive ground plane around the first and second magnetic-flux-tunable elements, and
    said plurality of stray currents are configured to induce mutually cancelling magnetic fluxes at the location of the respective flux-sensitive part.

3. The superconducting circuit according to claim 2, wherein:
    each of said first and second current-driven superconductive on-chip flux bias lines terminates in said common superconductive ground plane through a respective first or second terminating section,
    the shortest direct path between the first and second terminating sections is cut by at least one gap in said common superconductive ground plane,
    the superconducting circuit comprises, adjacent to each of said first and second terminating sections, a respective superconductive bridge connection across said at least one gap, so that for a given terminating section any current flowing through the respective superconductive bridge connection is directed oppositely to a direction the same current takes flowing to or from said common superconductive ground plane through the terminating section.

4. The superconducting circuit according to claim 3, wherein:
   each of the current-driven superconductive on-chip flux bias lines comprises a flux-inducing section located adjacent to the respective flux-sensitive part,
   each of said first and second terminating sections continues from the respective flux-inducing section, is parallel thereto but oppositely directed with respect to current, and is located farther from the respective flux-sensitive part than the respective flux-inducing section,
   each of said superconductive bridge connections is parallel to the respective flux-inducing and terminating sections and connects a point between said flux-inducing and terminating sections to a point of the common superconductive ground plane on the opposite side of the gap.

5. The superconducting circuit according to claim 3, wherein the superconductive bridge connection goes through an airbridge.

6. The superconducting circuit according to claim 3, wherein the superconductive bridge connection goes through a dedicated layer in a superconductive multilayer structure.

7. The superconducting circuit according to claim 2, wherein:
   each of said current-driven superconductive on-chip flux bias lines comprises a differentially driven current loop with respective incoming and outgoing lines between a current source and the respective magnetic-flux-tunable element, and a flux-inducing section between the incoming and outgoing lines adjacent to the respective flux-sensitive part,
   each of said current-driven superconductive on-chip flux bias lines is separated from said common superconductive ground plane by gaps extending on both sides of the respective current-driven superconductive on-chip flux bias line,
   the superconducting circuit comprises, adjacent to a first flux-inducing section, a first grounding connection across the gap,
   the superconducting circuit comprises, adjacent to a second flux-inducing section, a second grounding connection across the gap, and
   the superconducting circuit comprises superconductive bridge connections across each ensemble of gap, incoming line, outgoing line, and gap, each of said superconductive bridge connections being located farther from the respective flux-sensitive part than the respective grounding connection.

8. The superconducting circuit according to claim 7, wherein:
   each of said superconductive bridge connections is located at a distance from the respective flux-sensitive part at which a stray current originating from the current-driven superconductive on-chip flux bias line of the other magnetic-flux-tunable element is distributed into a first stray current component through the superconductive bridge connection and a second stray current component circulating the respective magnetic-flux-tunable element, so that said first and second stray current components induce mutually cancelling magnetic fluxes at the location of the respective flux-sensitive part.

9. The superconducting circuit according to claim 1, wherein:
   the superconducting circuit comprises a sectioned superconductive ground plane around the first and second magnetic-flux-tunable elements, and
   the sectioning of said sectioned superconductive ground plane is defined by one or more gaps that prevent the plurality of stray currents from flowing adjacent to the respective flux-sensitive part.

10. The superconducting circuit according to claim 9, wherein:
    said sectioned superconductive ground plane comprises a middle section located between said first and second magnetic-flux-tunable elements, and
    the first current-driven superconductive on-chip flux bias line terminates in said middle section, while the second current-driven superconductive on-chip flux bias line is separated from said middle section by one of said gaps.

11. The superconducting circuit according to claim 10, wherein another of said gaps cuts any circular current paths from the second current-driven superconductive on-chip flux bias line to said middle section around the second magnetic-flux-tunable element.

12. The superconducting circuit according to claim 9, wherein:
    a gap in said sectioned superconductive ground plane separates a first section around the first magnetic-flux-tunable element from a second section around the second magnetic-flux-tunable element.

13. The superconducting circuit according to claim 10, comprising capacitive couplings across one or more of said one or more gaps.

* * * * *